(12) United States Patent
Riley

(10) Patent No.: US 6,944,257 B2
(45) Date of Patent: Sep. 13, 2005

(54) PHASE ERROR CANCELLATION CIRCUIT AND METHOD FOR FRACTIONAL FREQUENCY DIVIDERS AND CIRCUITS INCORPORATING SAME

(75) Inventor: Thomas Atkin Denning Riley, Osgoode (CA)

(73) Assignee: Kaben Research Inc., Osgoode (CA)

( * ) Notice: Subject to any disclaimer, the term of this patent is extended or adjusted under 35 U.S.C. 154(b) by 95 days.

(21) Appl. No.: 10/400,468

(22) Filed: Mar. 28, 2003

(65) Prior Publication Data

US 2003/0219091 A1 Nov. 27, 2003

Related U.S. Application Data

(60) Provisional application No. 60/367,744, filed on Mar. 28, 2002.

(51) Int. Cl.[7] .............................................. H03K 21/00
(52) U.S. Cl. ........................... 377/47; 377/48; 327/115; 327/117
(58) Field of Search ..................... 377/47, 48; 327/115, 327/117

(56) References Cited

U.S. PATENT DOCUMENTS

| | | | |
|---|---|---|---|
| 4,179,670 A | 12/1979 | Kingsbury | |
| 4,697,156 A | 9/1987 | Rudolph | |
| 4,965,531 A | 10/1990 | Riley | |
| 5,055,800 A | 10/1991 | Hietala et al. | |
| 5,055,802 A | 10/1991 | Hietala | |
| 5,448,191 A | 9/1995 | Meyer | |
| 5,495,206 A | 2/1996 | Hietala | |
| 5,825,253 A | * 10/1998 | Mathe et al. | ................ 331/1 B |
| 6,600,378 B1 | * 7/2003 | Patana | ........................ 331/1 A |

FOREIGN PATENT DOCUMENTS

WO    WO 00 62428    10/2000

OTHER PUBLICATIONS

Kenny, T.P et al "Design and Realization of a Digital Delta–Sigma Modulator for Fractional–n Frequency Synthesis", IEEE Transactions on Vehicular Technology, Mar. 1999.

* cited by examiner

*Primary Examiner*—Margaret R. Wambach
(74) *Attorney, Agent, or Firm*—Thomas Adams

(57) ABSTRACT

A frequency divider circuit (11) has an input port for an input signal ($F_o$) to be divided, an output port for a divided signal ($F_{DIV}$), and means (12–19) for providing a variable division-ratio control signal (N+C) and a residual quantization error signal (R), applying the variable division ratio control signal (N+C) to a control port of the frequency divider, and using the residual quantization error signal (R) to cancel phase error in the divided signal. Both the variable division ratio control signal (N+C) and the residual quantization error signal (R) are dithered.

41 Claims, 10 Drawing Sheets

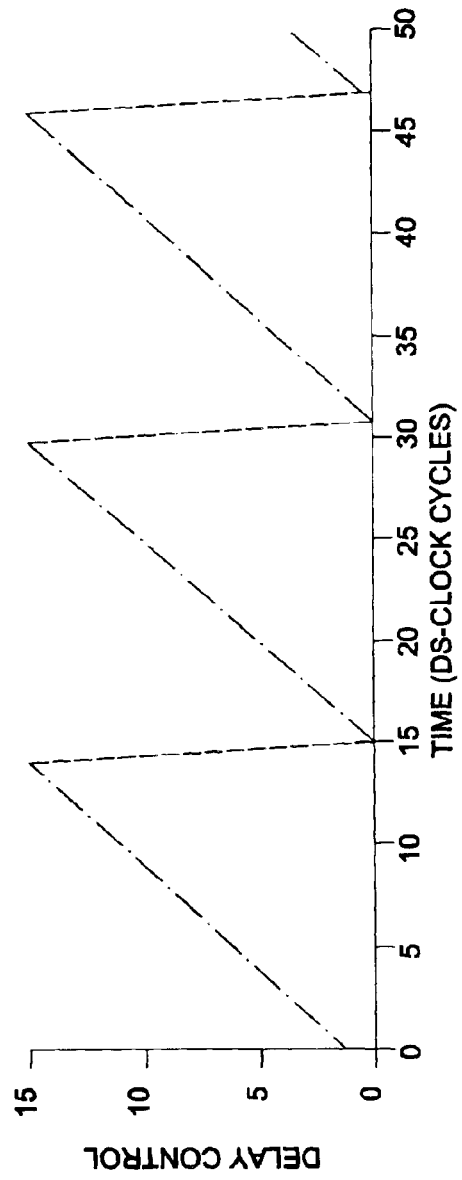
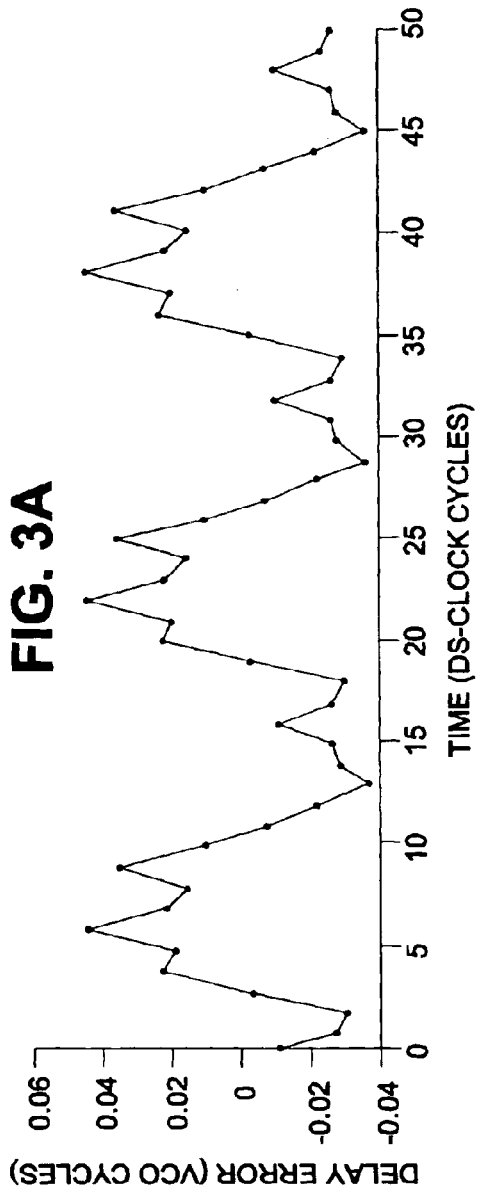
FIG. 3A
FIG. 3B

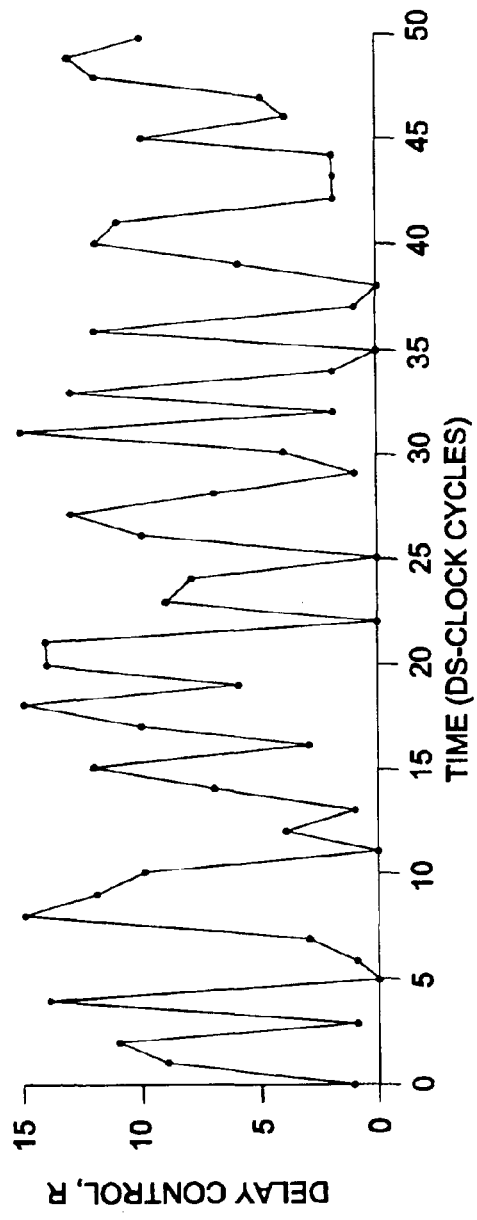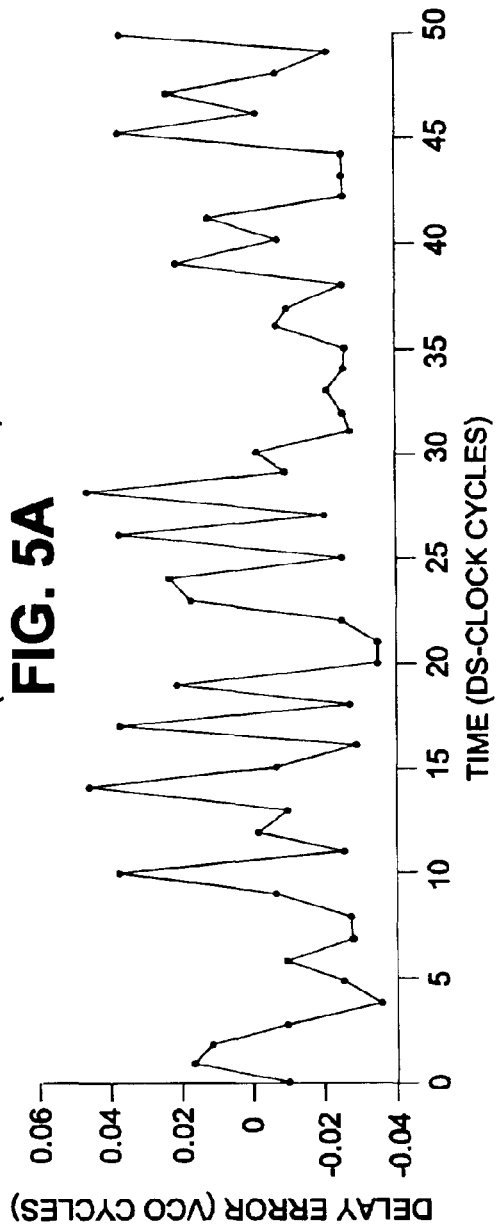
FIG. 5A
FIG. 5B

PHASE ERROR CANCELLATION CIRCUIT AND METHOD FOR FRACTIONAL FREQUENCY DIVIDERS AND CIRCUITS INCORPORATING SAME

This application claims priority from U.S. Provisional patent application No. 60/367,744 filed Mar. 28, 2002.

BACKGROUND OF THE INVENTION

1. Technical Field

The present invention relates to phase error cancellation in frequency dividers of the kind in which a division ratio is varied with time so that, over time, a desired average division ratio is obtained. The invention relates to phase-cancellation circuits per se, and to circuits, such as phase-locked loops, fractional dividers and frequency synthesizers, incorporating same.

2. Background Art

Known frequency dividers use different division ratios to obtain an average division ratio. Because each different division ratio produces a different phase delay, the phase difference between the input signal and the output or divided signal varies. Because the division ratios are known, the phase variation or error can be predicted, and means provided to compensate for it, or cancel it.

One compensation approach is to use a Delta-Sigma modulator to vary the division ratio more randomly. Thus, it is known for frequency synthesizers to use Delta-Sigma Modulators and integer-N dividers. A Delta-Sigma Modulator produces a quantized (1 to several bit) output from a high resolution (many bit and/or analog) input with the error resulting from this quantization spectrally shaped to reduce the spectral density of the error within some predetermined signal bandwidth. For frequency synthesizer applications, this bandwidth is typically centered around dc and multiples of the Delta-Sigma Clock frequency. Examples of such frequency synthesizers can be found in U.S. Pat. No. 4,965,531 (Riley) and U.S. Pat. No. 5,495,206 (Hietala) which are incorporated herein by reference. A disadvantage of these synthesizers is that the quantization step size is inherently 1 cycle of the high frequency signal, with frequency Fo and period To=1/Fo, applied to the divider. This makes the quantization noise large relative to the high frequency input signal.

Delta-Sigma modulators for use in frequency synthesizers may comprise other smaller Delta-Sigma modulator units. For example, in "Design and Realization of a Digital Delta-Sigma Modulator for Fractional-n Frequency Synthesis" by T. P. Kenny, T. A. D. Riley, N. M. Filiol and M. A. Copeland presented in the IEEE Transactions on Vehicular Technology, March 1999, many possibilities are disclosed. Many MASH type of Delta-Sigma modulators use a quantity which, for convenience, will be called herein the "Residual Quantization Error", (R). In a Delta-Sigma modulator, there are many well known ways to obtain this Residual Quantization Error R. For example, the aforementioned paper illustrates and discusses a first order Delta-Sigma Modulator with single bit quantizer that is equivalent to an accumulator and in which the sum output represents the Residual Quantization error R. In this case the accumulator provides an Inherent Residual Quantization Error, R. This error is described as "inherent" because it is available for use with no added circuitry.

U.S. Pat. No. 5,055,802 (Heitala) discloses a Delta-Sigma modulator for use in a synthesizer in which the quantizer is a means for selecting the most significant bits (MSBs) of a digital signal to be quantized, the remaining least significant bits (LSBs) providing the Residual Quantization Error R. Since these LSBs are required to be there for the accumulator to function, they provide an Inherent Residual Quantization Error R. If this residual quantization error R is not available inherently, it can be derived explicitly by subtracting the output of the quantizer from the input to the quantizer. This difference then provides an Explicit-Difference Residual Quantization Error R.

Such Delta-Sigma modulator-based devices are not entirely satisfactory, however, because the minimum phase deviation which they can introduce is one full cycle of the high frequency signal applied to the divider. As a result, the error signals are relatively large and cause unacceptable jitter at the output of the divider.

The alternative approach uses a phase error cancellation circuit to subtract an error signal known a priori from the input signal before application to the divider or from the divided signal leaving the divider, or a signal derived therefrom. The circuit disclosed in U.S. Pat. No. 5,495,206 (Hietala), supra, not only modulates the division ratio directly but also provides partial cancellation of the phase error caused by the varying division ratio. Hietala's approach is not entirely satisfactory, however, because it does not reduce the jitter at the output of the divider, specifically because the minimum step size at the delta-sigma modulator output remains equal to 1 cycle of the high frequency input. Furthermore, Hietala does not disclose a fractional divider wherein the delta-sigma step size is less than one cycle of the high frequency input signal. In FIG. 5 of Hietala, a charge pump 153 subtracts an estimate of the error signal, known a priori, from a signal derived from the output of divider 140 by a phase detector 152. When the error signal is subtracted from a signal derived from the divider output, it is necessary to match the error signal path with the divider output path in both gain and delay. For this reason, it is preferred to cancel the error within the divider. This preference has been recognized in the prior art but does not detract from the general equivalence of subtracting the error within the divider and subtracting the error form a signal derived from the divider output.

In other known devices, a separate phase error cancellation circuit is provided, for example entirely within a fractional divider, or comprising some components inside and others outside the fractional divider. Generally, however, although these known phase error cancellation circuits provide correction smaller than one cycle of the high frequency divider input, they utilize an error-reduction signal which is periodic. As a result, the error-correction signal and hence the output or divided signal are subject to spurs, i.e., periodically-occurring phase errors.

A conventional divider will have a rising edge and a falling edge for each cycle of the divider output. Many phase detectors respond to only one of these two edges, the "active" edge, in which case the period of the divider is the time between two consecutive active edges. Fractional division can be achieved with a combination of counting input cycles at the divider input and delaying the active edge of the divider output. For example, dividing by 5¼ can be achieved by the following steps:

(i) counting 5 cycles and delaying the active edge by ¼ of a cycle;
(ii) counting a further 5 cycles and delaying the active edge by ½ of a cycle;
(iii) counting a further 5 cycles and delaying the active edge by ¾ of a cycle;
(iv) counting a further 6 cycles and not delaying the active edge.

These steps then are repeated.

A Controlled Delay Divider may be used to perform these steps. A Controlled Delay Divider (CDD) produces an output pulse at a frequency (having a period and a controlled delay), $F_{DIV}$, from one or more high frequency inputs having a frequency, Of. The period may be either predetermined, or controlled by an external input N, such that each period of the output pulse is N times the period of the input frequency plus some additional controlled delay. In a CDD, this delay can be controlled by a delay control input R which causes the additional delay to be R times dT, where dT is typically some predetermined fraction 1/Np, of high frequency input period. In the example above, Np is 4 and the ordered pair (N,R) takes on values (5,1), (5,2), (5,3), (6,0). The prior art has recognized that the sequence of values for R can be provided by a modulo Np accumulator with the carry out of the accumulator incrementing the integer part of the desired division ratio. It should be noted that the input signal N is the signal that causes the divider to divide by N and need not necessarily be a binary representation of the number N. For example, a divider that loads the binary number k and counts up from there to 255 and then reloads a new value for k, will divide by N=256−k.

Some divider architectures will have a more complicated input that causes the divider to divide by N. As another example, high speed dividers designed for low power consumption may have two binary words producing a composite input which causes the divider to divide by N; one of these words may be sent to an M-counter, the other word to an A-counter with the divide ratio N further depending on a predetermined prescaler value also. Although these relationships may be complicated, they are well defined in the prior art and within the skill of those versed in that art. Similarly, the delay control input, R, is the input which causes the delay to be R times dT regardless of how the signal R is represented or how the signal R controls the controlled delay. To further clarify the meaning and to illustrate the reduction to practice of a CDD, two examples are provided. U.S. Pat. No. 5,448,191 (Meyer), which is incorporated herein by reference, describes an Edge Selecting Controlled delay divider. In Meyer's device, the three phases of the high frequency divider input, Φ1, Φ2 and Φ3, are generated by a three-stage voltage-controlled ring oscillator (VCO) oscillating at a frequency Of. This allows the output of the divider to be delayed by 0, ⅓ or ⅔ of one VCO cycle. Ideally these three phases should have exactly 0, 120 and 240 degrees of phase shift, but mismatches in the stages of the ring oscillator or (more generally) unmatched delays through the divider may cause some Delay Error. Difficulties in maintaining an equal distribution of phase shift or (more generally) a linear and properly scaled relationship between the delay control input and the Controlled Delay have limited the applicability of this type of fractional divider. Techniques to improve the delay linearity have also been disclosed in the prior art.

An improved ring oscillator with individually calibrated delays is described in "A 1.8-GHz Self-Calibrated Phase-Locked Loop with Precise I/Q Matching", Chan-Hong Park, et al., published in the IEEE Journal of solid state circuits May 2001, which is incorporated herein by reference. This example also illustrates how Controlled Delay is linearized through a feedback loop around each individual delay stage.

In both of these two Controlled Delay Divider examples, the different phases are generated outside the divider, but this is not generally necessary for a controlled Delay Divider.

These two examples also illustrate how Fractional Dividers comprising a Controlled Delay Divider can be used in a phase-locked loop (PLL) to create a fractional-N synthesizer. Limitations of such PLL synthesizers based on Controlled Delay Dividers are that they have resolution limited to the reference frequency divided by the number of available phases. If they are adapted to provide higher resolution by quantizing the accumulator value to use only the number of available phases, they produce "spurs", i.e., spurious output tones. This occurs even in the absence of errors in the controlled delay of the different phases. As illustrated in the article by Chan-Hong Park, et al., these spurious tones may be produced even when these errors are individually compensated.

There remains a need, therefore, for a phase cancellation circuit which reduces phase errors caused by spurs without using large error signals.

SUMMARY OF THE INVENTION

The present invention seeks to eliminate, or at least mitigate, such disadvantage.

According to one aspect of the present invention there is provided a frequency divider means having an input port for an input signal ($F_o$) to be divided, an output port for a divided signal ($F_{DIV}$), and means for providing a variable division-ratio control signal (N+C) and a residual quantization error signal (R), applying the variable division ratio control signal (N+C) to a control port of the frequency divider, and using the residual quantization error signal (R) to cancel phase error in the divided signal, wherein both the variable division ratio control signal (N+C) and the residual quantization error signal (R) are dithered.

The means for providing the variable division-ratio signal and the residual quantization error signal may comprises means for providing a constant portion (N) of the division ratio control signal (N+C), means for providing a dithered variable portion (C) of the division ratio control signal, and summing means for combining the constant portion (N) and the dithered variable portion (C) to form the variable division ratio control signal (N+C).

Preferably, the means for providing the dithered variable portion (C) comprises a delta-sigma modulator responsive to a dithered variable value (D) to provide both the dithered variable portion (C) and the dithered residual quantization error (R).

The delta-sigma modulator may be a first order delta-sigma modulator.

According to a second aspect of the invention there is provided a method of dividing an input signal ($F_o$) to obtain a divided signal ($F_{DIV}$), using a frequency divider, comprising the steps of providing a variable division-ratio control signal (N+C) and a residual quantization error signal (R), applying the variable division ratio control signal (N+C) to control the frequency divider, and using the residual quantization error signal (R) to cancel phase error in the divided signal, wherein both the variable division ratio control signal (N+C) and the residual quantization error signal (R) are dithered.

The step of providing a variable division-ratio control signal (N+C) may include the steps of providing a constant portion (N) of the division ratio control signal (N+C), and a dithered variable portion (C) of the division ratio control signal, and summing the constant portion (N) and the dithered variable portion (C) to form the variable division ratio control signal (N+C).

Preferably, the step of providing the dithered variable portion (C) uses a delta-sigma modulator responsive to a dithered variable value (D) to provide both the dithered variable portion (C) and the dithered residual quantization error (R).

According to a preferred embodiment of this second aspect of the invention, a method of dividing an input signal ($F_o$) by a non-integer value comprises the steps of:

(i) providing an integer value (N) and a fractional value (K/M) which together correspond to the non-integer value (N+K/M);

(ii) splitting the fractional value (K/M) into a first part ($K/M_{MSB}$) above a preset resolution and a second part ($K/M_{LSB}$) below said preset resolution;

(iii) using noise-shaped quantization, quantizing the second part ($K/M_{LSB}$) at a quantization resolution equal to the least significant bit of said first part ($K/M_{MSB}$) to produce a noise-shaping-quantized value;

(iv) summing said first part ($K/M_{MSB}$) and the noise-shaping-quantized value to produce a dithered value (D);

(v) quantizing the dithered value (D) to provide a quantized dithered value (C) having a resolution equal to the least significant bit of the integer value (N) and an integrated residual value (R);

(vi) summing said quantized dithered value (C) with said integer value (N) to provide a division ratio value (N+C); and (vii) in dependence upon said residual value (R), dividing the input signal frequency ($F_o$) by said division ratio value (N+C) to provide an output frequency ($F_{DIV}$).

The step of dividing the input signal frequency ($F_o$) may comprise the steps of deriving from said input signal ($F_o$) producing a plurality of signals differing in phase from each other; and selecting one of said plurality of signals as said output signal ($F_{DIV}$) in dependence upon said residual value (R).

The step of quantizing the second part ($K/M_{LSB}$) may use second- or higher order noise-shaped quantization.

According to a third aspect of the invention, there is provided an adjustable delay line having a plurality of delay elements, a corresponding plurality of inputs and a single output, the average element delay being adjustable in response to a control signal (Vc), and means for calibrating average element delay by comparing actual delay through the delay line with a reference ($F_o$) having a period equal to the prescribed delay through the delay line and providing the control signal (Vc) in dependence upon the difference therebetween, wherein the calibrating means comprises means for deriving from the reference signal ($F_o$) a first pulse (P2) and a second pulse (P3) separated by said period, supplying the first pulse (P2) to the phase detector by way of the delay line and the second pulse (P3) to the phase detector unit without passing through the delay line, the phase detector determining said difference as the difference between the arrival times of the first and second pulses.

The foregoing and other objects, features, aspects and advantages of the present invention will become more apparent from the following detailed description, in conjunction with the accompanying drawings, of preferred embodiments of the invention which are described by way of example only.

BRIEF DESCRIPTION OF DRAWINGS

FIGS. 3(a) and 3(b) illustrate the effect on Delay Error of periodically changing delay control of the Controlled Delay Divider of FIG. 2;

FIGS. 5(a) and 5(b) illustrate the effect on Delay Error of randomizing the delay control in the fractional divider of FIG. 4;

DESCRIPTION OF THE PREFERRED EMBODIMENTS

Figure 1:
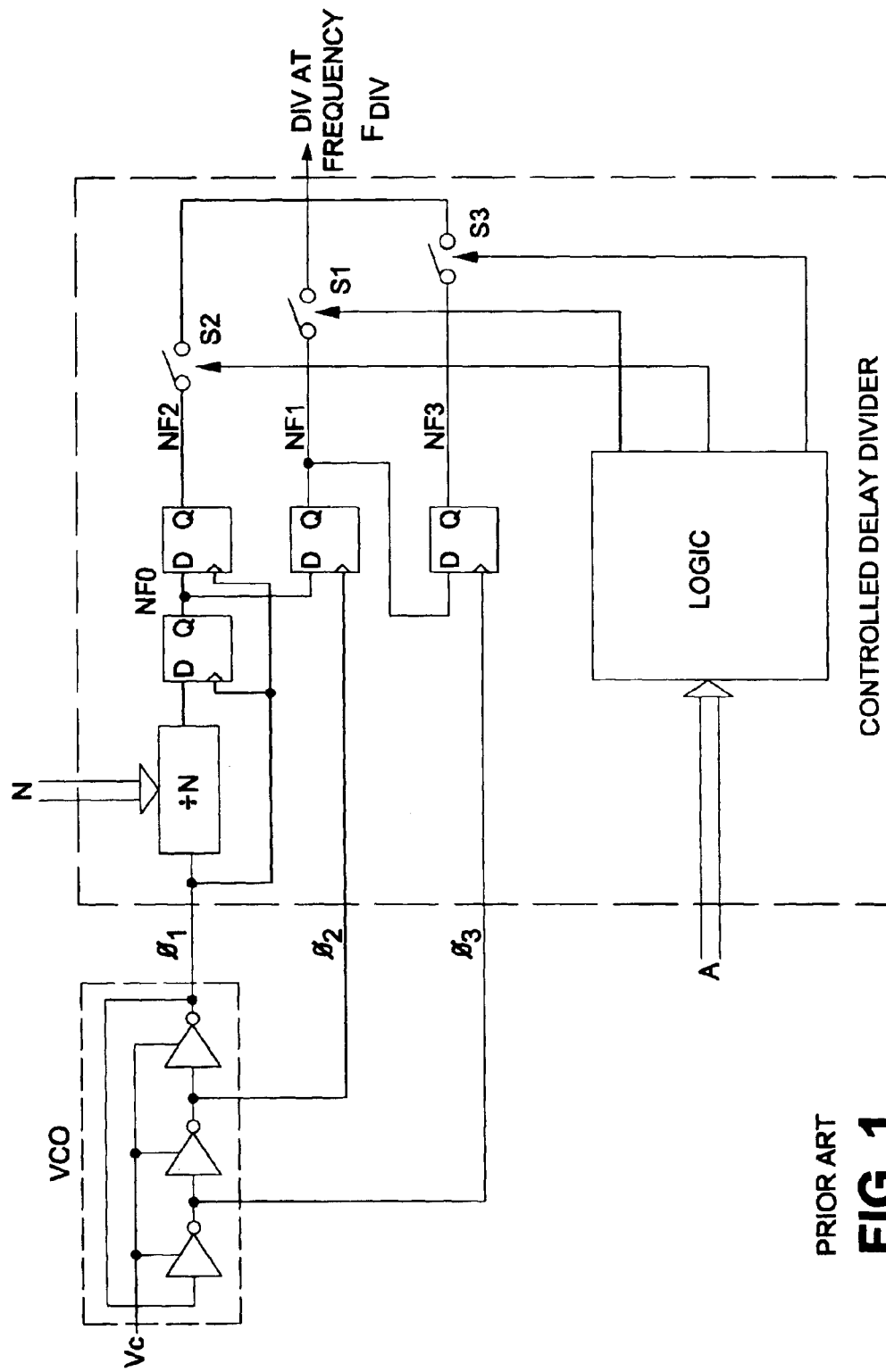
FIG. 1, labelled PRIOR ART, is a block diagram of a known 3-step Controlled Delay Divider.

In the drawings, identical or corresponding components in the different Figures have the same reference numbers, where appropriate with a prime to indicate a modification.

To facilitate an understanding of the present invention, known fractional dividers and the way they operate will first be described with reference to FIGS. 1, 2 and 3. Thus, FIG. 1, which replicates FIG. 5 of U.S. Pat. No. 5,448,191 (Meyer), illustrates a Controlled Delay Divider in which a three-stage voltage controlled ring oscillator 10-2 provides three signals Ph1, Ph2 and Ph3 having phases differing by 120 degrees which are "regenerated" to produce three divider output signals NF1, NF2 and NF3 with three different delays. Selecting the appropriate one of the signals NF1, NF2 and NF3 allows three possible phase values, varying by ⅓ of one VCO cycle, to be selected as the divider output pulse. Ideally, these three phases should have exactly 0, 120 and 240 degrees of phase shift, but mismatches in the stages of the ring oscillator or (more generally) unmatched delays through the divider, may cause some Delay Error. Difficulties in maintaining an equal distribution of phase shift or (more generally) a linear and properly scaled relationship between the delay control input and the Controlled Delay have limited the applicability of this type of fractional divider.

Figure 2:
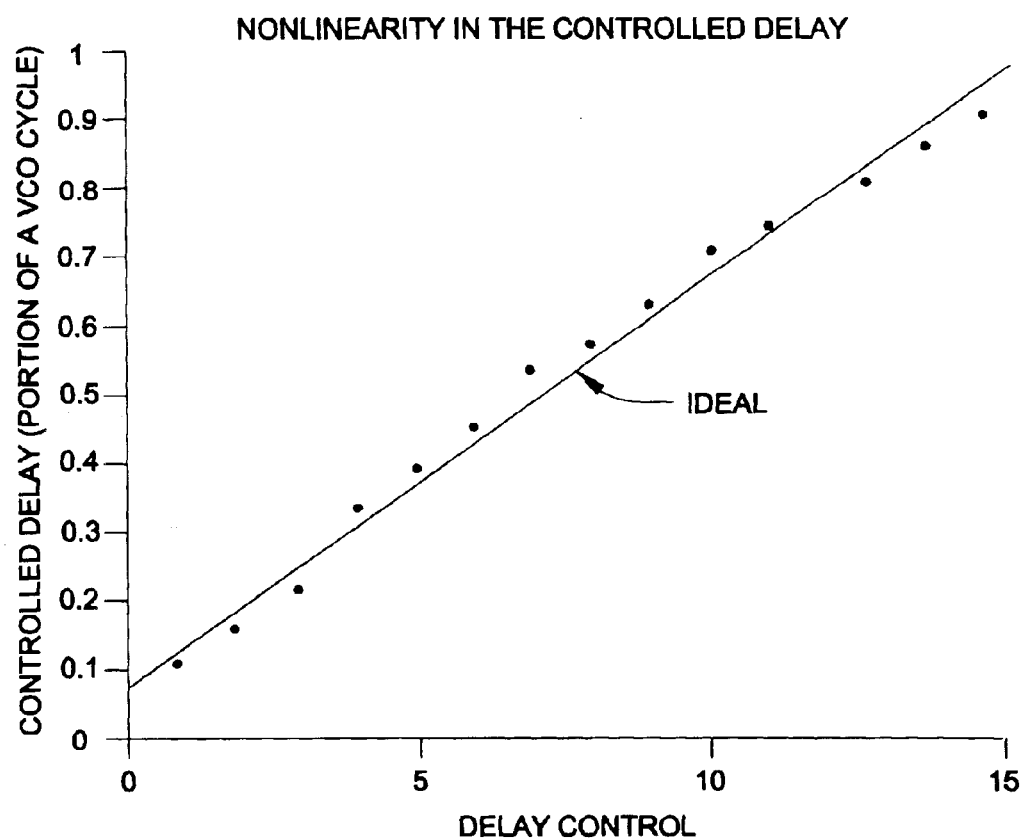
FIG. 2 illustrates a typical Delay Error of a 16-step Controlled Delay Divider.

FIG. 2 illustrates, as an example, how Controlled Delay varies as a function of Delay Control for a known Controlled Delay Divider (with Np=16) where the delay generated by the delay control is not ideal but rather has some error. FIG. 3(a) shows the time sequence for the delay control and FIG. 3(b) the resulting time sequence for the error introduced by a Controlled Delay Divider used in the manner taught by the prior art. The periodic changes in the delay control shown in FIG. 3(a) result in periodic changes in the Delay Error as shown in FIG. 3(b). It takes more design effort and more on-chip components to improve the delay linearity of a Controlled Delay Divider and ultimately there are fundamental limits to how much improvement can be achieved. The present invention, therefore, provides a fractional divider architecture which is less sensitive to delay nonlinearity in the Controlled Delay Divider.

Figure 4:
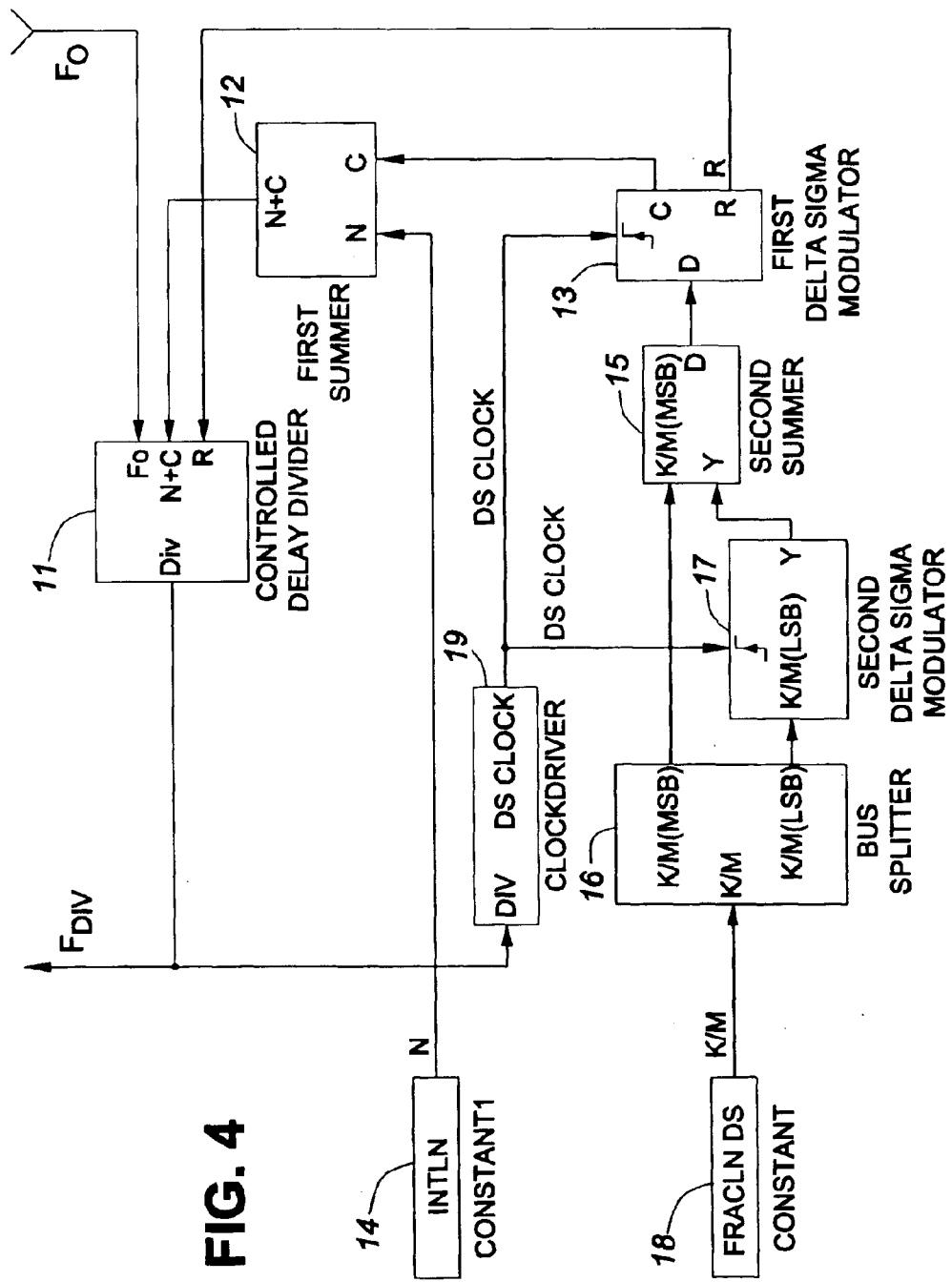
FIG. 4 is a block diagram of a fractional divider embodying the present invention.

A preferred embodiment of the present invention will now be described with reference to FIG. 4. The fractional divider shown in FIG. 4 comprises a Controlled Delay Divider 11 which divides a high frequency input signal with frequency Fo to provide an output signal with frequency $F_{DIV}$ having its period responsive to a division ratio value, N+C, supplied by a first summer 12 and a delay responsive to a Residual Quantization Error signal, R, supplied by a first delta-sigma modulator 13. The first summer 12 provides the division control value N+C in response to a quantized dithered value C supplied by the first delta-sigma modulator 13 and an integer value N input via a port 14. The first Delta-Sigma modulator provides the quantized dithered value, C, and the Residual Quantization Error, R, in response to a dithered value, D, supplied by a second summer 15. The second summer sums a most significant part $K/M_{MSB}$ of a fractional input value provided by a bus splitter 16 and a noise-shaping quantized value Y supplied by a second Delta-Sigma modulator 17. The second delta-sigma modulator 17 quantizes a least significant fractional value $K/M_{LSB}$ from the bus splitter 16 to form the noise-shaping quantized value Y. The bus splitter 16 derives the most significant bits $K/M_{MSB}$ and the least significant bits $K/M_{LSB}$ by splitting a fractional value K/M inputted via a second port 18. The first and second delta-sigma modulators 13 and 17 are clocked by a Delta-Sigma Clock, DS Clock, from a clock driver 19. In FIG. 4, the clock driver 19 is shown using the output pulse Fdiv to derive the Delta-Sigma Clock DS Clock. It is possible, however, to derive the clock signal in other ways, such as, for example, from a PLL reference clock signal or from within the Controlled Delay Divider.

The divider shown in FIG. 4 operates as follows:

The high frequency signal is substantially sinusoidal and has a frequency Fo of 2 GHz. The Controlled Delay Divider 11 may provide 16 possible delays in increments of 1/16th of a cycle of the high frequency input signal Fo. Different binary values of the Residual Quantization Error R ranging from 0 to 15 will select corresponding delays ranging from 1/16th to one cycle of the input frequency Fo.

The division ratio value N+C from first summer 12 is a 7-bit unsigned binary number between 64 and 127 which the first summer 12 produces by adding a two's complement 4-bit binary number, C, (−4 to +3) to an unsigned 7-bit binary number N (67 to 123). Sign extension of C may be required. The LSB of Y is added with the same weight as the LSB of $K/M_{MSB}$, i.e., the numbers C and N are added bit by bit beginning with the LSB of each.

The first Delta-Sigma modulator 13 produces the 4-bit signed value C and the 4-bit unsigned value R from an 8-bit signed (two's complement) input D. The first Delta-Sigma modulator 13 is a first-order Delta-Sigma modulator with a multi-bit quantizer. It should be noted that an accumulator (being equivalent to a first-order Delta-Sigma modulator with a single-bit quantizer) is inadequate for some combinations of $K/M_{LSB}$ and Y.

The second summer 15 adds an 8-bit signed binary number Y to a 4-bit unsigned binary number $K/M_{MSB}$ to produce the 8-bit signed input D. The LSB of Y is added with the same weight as the LSB of $K/M_{MSB}$, as in the case of C and N. Since $K/M_{MSB}$ is unsigned, sign extension of $K/M_{MSB}$ may not be required.

The bus splitter 16 provides the four MSB's of the unsigned 24 bit input K/M as $K/M_{MSB}$ and the 20 LSBs of the 24 bit input K/M as an unsigned 20 bit value $K/M_{LSB}$. The second Delta-Sigma modulator 17 randomizes and noise shapes the unsigned 20-bit value $K/M_{LSB}$ to produce the 8-bit output value Y. The four bits of R and $K/M_{MSB}$ correspond to the sixteen possible values of controlled delay in the Controlled Delay Divider.

The second Delta-Sigma modulator 17 conveniently comprises a MASH Delta-Sigma modulator of the kind described in "Design and Realization of a Digital Delta-Sigma Modulator for Fractional-n Frequency Synthesis" by T. P. Kenny, T. A. D. Riley, N. M. Filiol and M. A. Copeland, presented in the IEEE Transactions on Vehicular Technology, March 1999, to which the reader is directed for further details. A fourth-order MASH type of Delta-Sigma modulator is described in U.S. Pat. No. 5,495,206, which also describes how to extend it to higher orders. Preferably, the second Sigma-Delta modulator 17 is 7th order.

Increasing the order of the second Delta-Sigma modulator 17 improves the randomization of Residual Quantization Error signal R and thus reduces the spurs. If higher order modulators are used, the range of values for Y, D, C and N+C will have to increase, possibly requiring wider buses for these signals. Correspondingly, either the range of N+C accepted by the Controlled Delay Divider 11 will have to increase or the range of N will have to decrease.

The clock driver 19 which supplies the Delta-Sigma Clock (DS Clock) must provide drive capability to clock all flip-flops in the two Delta-Sigma modulators 13 and 17 with clock skew adequate for the timing tolerances of the flip-flops.

In operation, using the randomized Residual Quantization error R shown in FIG. 5(a) as the delay control for the divider 11 causes the Delay Error in the divider output signal Fdiv to be randomized also, as shown in FIG. 5(b). Consequently, spurs are reduced, since the delay error appears randomized rather than periodic.

Figure 6:
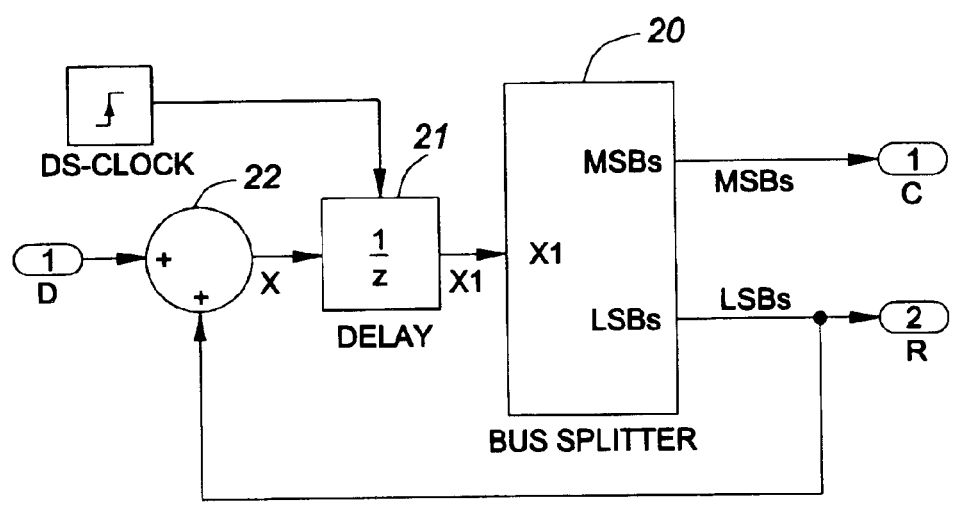
FIG. 6 is a block diagram of a first first-order Delta-Sigma Modulator of the fractional divider of FIG. 4.

As shown in more detail in FIG. 6, the first Delta-Sigma modulator 13 of FIG. 4 comprises a second bus splitter 20 which provides a predetermined number of LSBs of a delayed summed signal X1 as the Residual Quantization Error signal R, and provides remaining MSBs of delayed summed signal X1 as the quantized dithered value C. The second bus splitter 20 provides 4 LSBs in order to permit selection of 16 possible delays in the Controlled Delay Divider 11. A delay device 21 derives the delayed summed signal X1 by delaying, by one cycle of the Delta-Sigma Clock DS Clock, a summed signal X from a third summer 22. Where the second Delta-Sigma modulator 17 is 7th order, the delayed summed signal X1 is an 8-bit signed binary number, and the delay can be implemented with eight flip-flops clocked by the Delta-Sigma Clock "DS Clock".

The third summer 22 derives the summed signal X by summing the dithered value D from second summer 15 (FIG. 4) and the Residual Quantization Error R from the LSBs output of second bus splitter 20. Where the second Delta-Sigma modulator 17 is 7th order, the summed signal X is an 8-bit signed binary number, and can be implemented with an 8-bit adder. Since the residual Quantization error signal R is only four bits wide, some of the segments of the 8-bit adder can be reduced to half adders rather than full adders.

Figure 7:
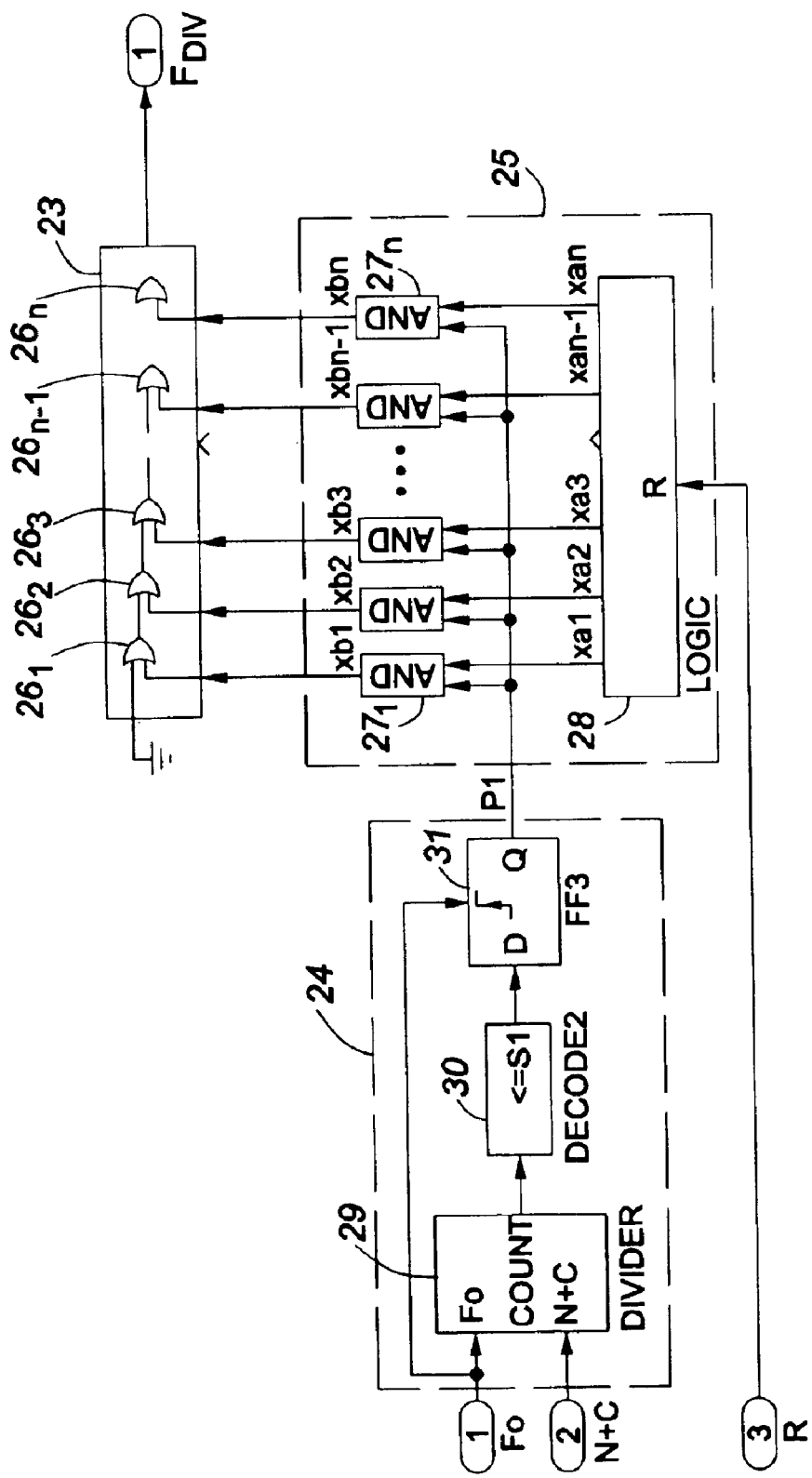
FIG. 7 is a block diagram of a Programmable-Delay Controlled Delay Divider of the fractional divider of FIG. 4.

The Controlled Delay Divider 11 preferably is a Programmable-Delay Controlled Delay Divider, as shown in FIG. 7, comprising a multiple input single output (MISO) delay line 23, a divider unit 24 and a control unit 25 which selectively routes the output from the divider 24 to the inputs of the MISO delay line 23. Such a Controlled Delay Divider 11 advantageously can be used with a VCO producing only one output phase. This makes it convenient to have an off-chip VCO or any VCO which does not generate multiple phases, such as a VCO based on an LC tank resonator. The Programable-Delay Controlled Delay Divider 11 produces a controlled delay on the rising edge of the divided signal $F_{DIV}$ in response to the Residual Quantization Error R and a period responsive to the division control signal N+C. When the delay is controlled on only the rising (or falling) edge, the phase detector used in any PLL synthesizer should be rising (or falling) edge triggered.

The MISO delay line 23 has multiple inputs and one output with the output being related to one of the inputs so that, when the active input is held high, the output will also eventually be high (or alternatively low) and when the active input is held low, the output will eventually be low (or alternatively high). There is a different delay for each path through the MISO delay line, though the logical output of the MISO delay line does not depend on the propagation path from input to output.

The MISO delay line 23 provides a delay which depends upon the input used as the active input. This is accomplished by having multiple stages in the delay line, with one input for each stage, with each stage contributing some delay. The stages near the end of the delay line then will have less delay and the stages near the beginning of the delay line will have more delay. Thus, referring again to FIG. 7, the stages of the MISO delay line 23 comprise logical OR gates $26_1, \ldots, 26_n$, each of which has a first input connected to the output of the previous gate and a second input coupled to the control unit 25 to receive a respective one of a plurality of delay control signals $xb1, \ldots, xb_n$. Because the OR gates $26_1, \ldots, 26_n$ are connected in series, the delay control signal $xb_n$ will pass through only one OR gate $26_n$ producing a delay of $T_o/n$, while the delay control signal $xb_{n-1}$ will pass through two OR gates $26_{n-1}$ and $26_n$ producing a delay of $2T_o/n$, and so on. A delay control signal $xb_1$ will pass through all of the OR gates $26_1, \ldots, 26_n$ producing a delay of $T_o$. Thus, as an example, if the MISO delay line 23 has 16 inputs $xb_1$ to $xb_{16}$ and 16 OR gates $26_1, \ldots, 26_{16}$, each stage will provide a delay $dT=T_o/16=\frac{1}{16}F_o$.

The control unit 25 controls the delay through the MISO 23 by selecting the appropriate one of the MISO delay control signals $xb_1, xb_2, \ldots xb_n$ for application to the corresponding stage of the MISO delay line 23. As shown in FIG. 7, the control unit 25 comprises a set of AND gates $27_1, \ldots, 27_n$ each having one input coupled to the output of the divider unit 24 and the other input to a logic unit 28 which enables the AND gates $27_1, \ldots, 27_n$ selectively in dependence upon the Residual Quantization Error R. The outputs of the AND gates $27_1, \ldots, 27_n$ are coupled to the second inputs of the logical-OR gates $26_1, \ldots, 26_n$, respectively.

The logic unit 28 provides the ENABLE signals for the AND gates in response to the Residual Quantization Error signal R. Preferred encoding for R is a binary code because this simplifies the first Delta-Sigma modulator 13 (FIG. 6). The logic unit 28 decodes binary code for R to provide the signals $xa_1, xa_2 \ldots xa_{n-1}, xa_n$ so that, when R calls for minimum delay, the propagation of the output signal P1 from divider unit 24 to the delay line goes through AND gate $27_n$ and, when R calls for a maximum delay, the propagation of output signal P1 to the delay line goes through AND gate $27_1$. For example, if R is a binary encoded 4-bit number, the logic unit 28 would decode $xa_n$ for R=0, $xa_2$ for R=14, $xa_1$, for R=15, and so on. The logic unit 28 may not be necessary if, for example, R is directly thermometer coded rather than binary coded.

The divider 24 comprises a 7-bit loadable down counter 29 and a first decoder 30 for determining when the counter 29 is within the last 16 cycles of its count. The down-counter 29 counts down when in a non-zero state and loads a new value, N+C, when in the zero state. On each rising edge of the high frequency signal with frequency Fo, the counter 29 advances to the next state.

The decoder 30 provides a timing signal S1 which is a logical 1 output when the state of the counter 29 is less than or equal to some predetermined state and a logical 0 otherwise. The signal S1 could serve directly as the output of divider 24 but it is preferred to use flip-flop 31 to retimes the S1 signal. This reduces timing errors introduced by the decode unit 30. Thus, the output of the decoder 30 advantageously is resynchronized to the high frequency input signal $F_o$. This resynchronization reduces the effect of power supply dependent delays in the counter 29 and the decoder 30. The resynchronization is provided by means of a flip-flop 31 clocked by the high frequency signal $F_o$. The output of the decoder 30 is supplied to data input D of the flip-flop 31 and the output of the flip-flop 31 provides the output pulse P1 of the divider 24.

The logic block 28 may comprise a series of binary decoders arranged to decode a binary input of R=0 to set only $xa_n$ to a logic one, thus enabling a path from P1 through $xb_n$ to produce a minimum delay. Similarly, the binary decoders would decode R=n−1 to set only $xa_1$ high enabling a path through xb1 for a maximum delay. For intermediate delays, the binary decoders would decode the corresponding value of R to select the appropriate one of the intermediate OR gates $26_2, \ldots, 26_{n-}$.

Enabling only one of the AND gates $27_1, \ldots, 27_n$, enables only one path for the output signal P1 through to the $F_{DIV}$ output of the Controlled Delay Divider 11. (With the OR gate based delay line, enabling only $xa_3$, for example, is equivalent to enabling $xa_3$ and any combination of $xa_1$ or $xa_2$; enabling only $xa_3$ is more instructive.)

For an ideal MISO delay line 23 with n stages, the delay of each stage is equal. For an ideal MISO delay line as used in a Programable-Delay Controlled Delay Divider, the difference in delay from the minimum to the maximum should be exactly (n−1)/n times one period of the high frequency signal with frequency, Fo. Practical delay lines, however, will have unequal delays due to mismatches in the delay stages. Process variation may also result in all of the delays being slower or faster. The deviations from ideal behaviour result in spurious output frequencies from the synthesizer but are mitigated by the pseudo-randomization of the second Delta-Sigma quantizer. This may require "binning" or selecting the devices following manufacture for use at particular frequencies depending on the process variations; or may require good process control to get the variations within acceptable limits.

In order to obtain the lowest level of spurs, every effort should be made to make sure that the delay of each stage matches and that the difference in delay from the minimum to the maximum delay is close enough to ideal for the prescribed operating frequency $F_o$.

It may also be necessary to control the ambient temperature about the delay line to remove temperature variations or to use temperature or voltage to control the delay. The voltage or temperature used to control the delays can be controlled with a feedback loop.

Figure 8:
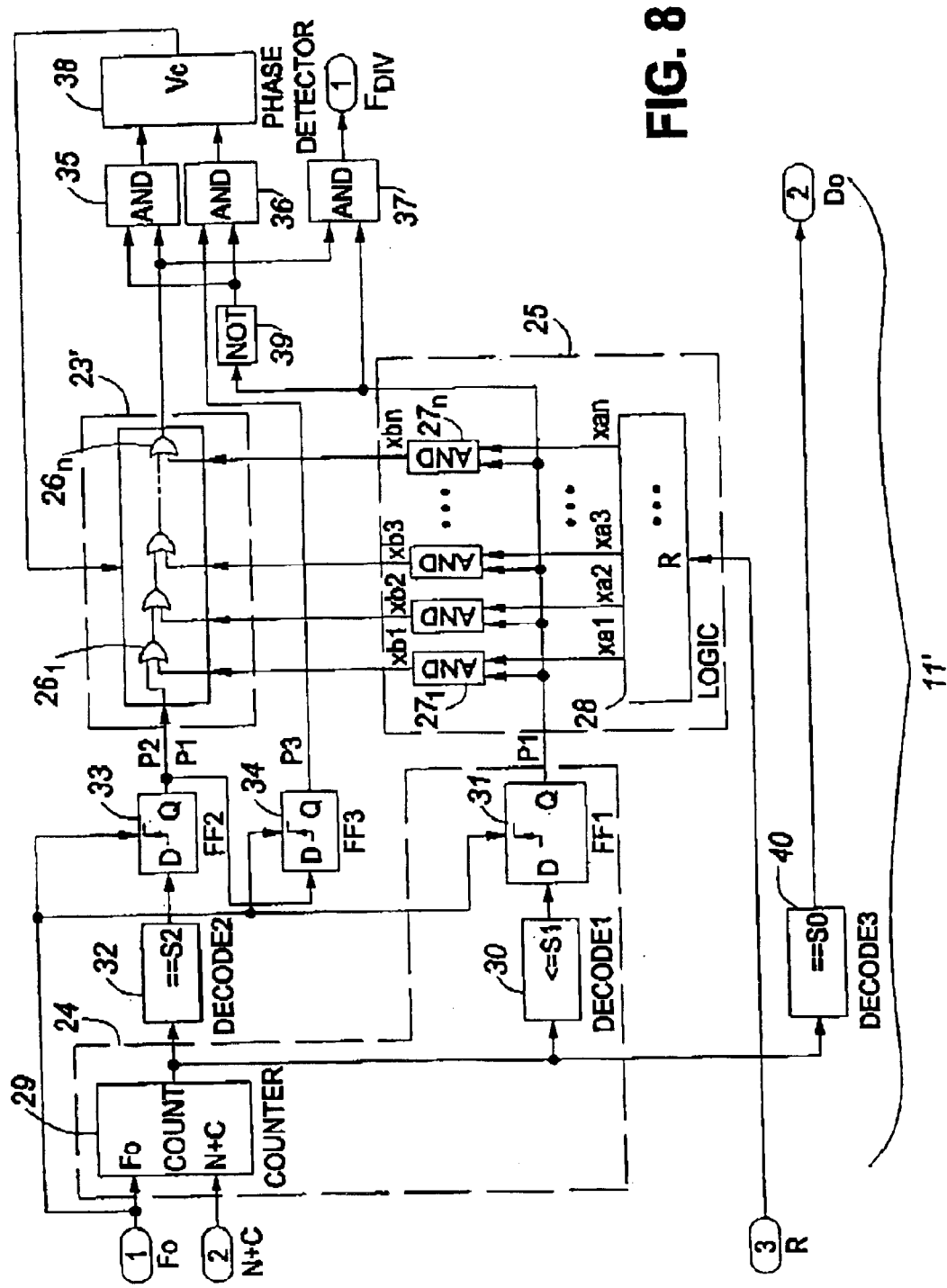
FIG. 8 is a block diagram of the Programmable-Delay Controlled Delay Divider of FIG. 7 with extra details shown.

FIG. 8 is an illustration in block diagram form of a Programable-Delay Controlled Delay Divider 11' similar to that of FIG. 7 but with two modifications, one to address the problem of delay variations and the other to provide a delayed output pulse. The Programmable-Delay Controlled Delay Divider 11' comprises a controllable-delay MISO delay line 23', a control unit 25, and a divider unit 24. The control unit 25 and divider unit 24 are identical to those shown in FIG. 7. The MISO delay line 23', however, differs in that all of the delays can be reduced or increased by means of a control signal $V_c$.

In normal operation, the Programable-Delay Controlled Delay Divider 11' operates in the same manner as that described with reference to FIG. 7. Periodically, however, the Programmable-Delay Controlled Delay Divider 11' performs a calibration cycle to determine changes in the delay provided by the MISO delay line 23' and makes appropriate adjustments to the delays $26'_1, \ldots, 26'_n$ to compensate. The calibration circuitry comprises a second decoder 32, second and third flip-flops 33 and 34, three additional AND gates 35, 36 and 37, a phase detector 38, and a NOT inverter 39, operation of which will now be described.

As before, the counter 29 loads an initial value I and counts down with the value of the Count reduced by one for each cycle of the high frequency signal with frequency Fo. The value of the Count starts at the initial value I, determined by N+C, and is reduced through states I, I–1 . . . , S2+2, S2+1, S2, . . . S1, and finally 0, whereupon the counter 29 loads a new value of I, determined by N+C again, and continues. The Count which represents the counter state (or some of its MSBs) is provided to first decoder block 30, as before, and to the second decoder block 32. The second decoder block 32 produces a second timing signal S2, which is high when the Count is equal to some predetermined state higher than that which corresponded to S1 as described above. As before, the first decoder block 30 produces a timing signal S1 which is high when the divider is in state S1 or lower.

The second retiming flip-flop 33 retimes the timing signal S2, producing a delay line input pulse P2 which is applied to the input of the MISO delay line 23'. The third flip-flop 34 delays the pulse P2 from second flip-flop 33 by one cycle of the high frequency signal with frequency Fo, producing a calibration pulse P3 which is supplied to one input of AND gate 36. The second and third flip-flops 33 and 34 are clocked by the high frequency input signal $F_o$.

The output of the MISO delay line is supplied to one input of the other AND gate 35. The outputs of the AND gates 35 and 36 are applied to respective inputs of the phase detector 38. The other inputs of the two AND gates 35 and 36 are connected in common to the output of NOT inverter 39, the input of which is coupled to the output of first retiming flip-flop 31. The output of the phase detector is the control signal $V_c$ which is supplied to the MISO 23' and used to adjust the delays therein. The output of the MISO delay line 23' and the output of the first retiming flip-flop 31 are supplied to respective inputs of AND gate 37, whose output is the output signal $F_{DIV}$.

In this embodiment, a calibration is performed before each output pulse is generated. Following output of a previous pulse, the NOT inverter 39 enables the AND gates 35 and 36 to pass the output of the delay line 23' and output of third retiming flip-flop 34 to be applied to the phase detector 38, which detects whether or not the output of the delay line 23' arrives before or after the output of the third retiming flip-flop 34 and adjusts each of the delay stages by the same amount so as to reduce any difference.

On the next cycle, the NOT inverter 39 will disable the AND gates 35 and 36 so that the next pulse from the MISO delay line 23' will be supplied via AND gate 37 as the output pulse $F_{DIV}$.

The feedback provided by the phase detector 38 is negative feedback resulting in a stable Delay locked loop. For example, if the output of the delay line 23' arrives earlier than the calibration pulse, the delays should be increased. Conversely, if the output of the delay line 23' arrives later than the calibration pulse, the delays should be decreased.

Figure 9:
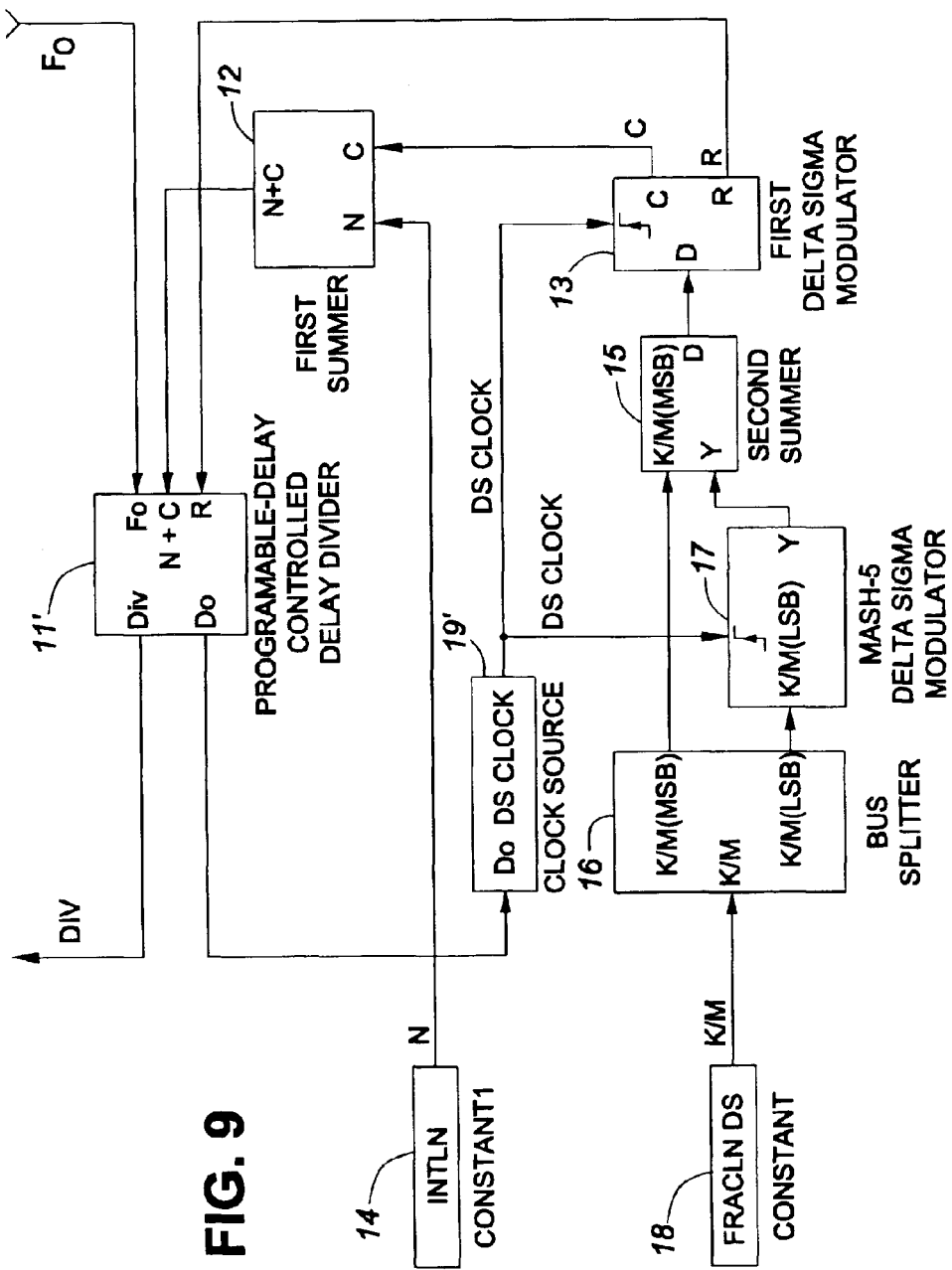
FIG. 9 is a block diagram of the Programmable-Delay Controlled Delay Divider of FIG. 7 modified by inclusion of a delayed divider output clock.

As mentioned earlier, the second modification is to provide a delayed output pulse. Thus, a third decoder 40 has its input connected to the output of counter 29 and responds to the state of the counter 29 to provide a third timing signal, $S_0$, when the Count is in state 0. Because this occurs after state S1, as the counter 29 counts down, the output ($S_0$) of the decoder 40 can be provided as the signal $D_0$, i.e., as an extra output from the Programmable-Delay Controlled Delay Divider 11'. As shown in FIG. 9, which is similar to FIG. 4, this second divider output $D_0$ may be used by Delta-Sigma Clock source 19' (FIG. 4) to generate the DS Clock used to clock the digital logic i.e., the first Delta-sigma modulator 13 and second Delta-sigma modulator 17 (FIG. 4) at a time slightly delayed from the edge that triggers the phase detector 38. This reduces interference from the digital logic to the phase detector 38.

Figure 10:
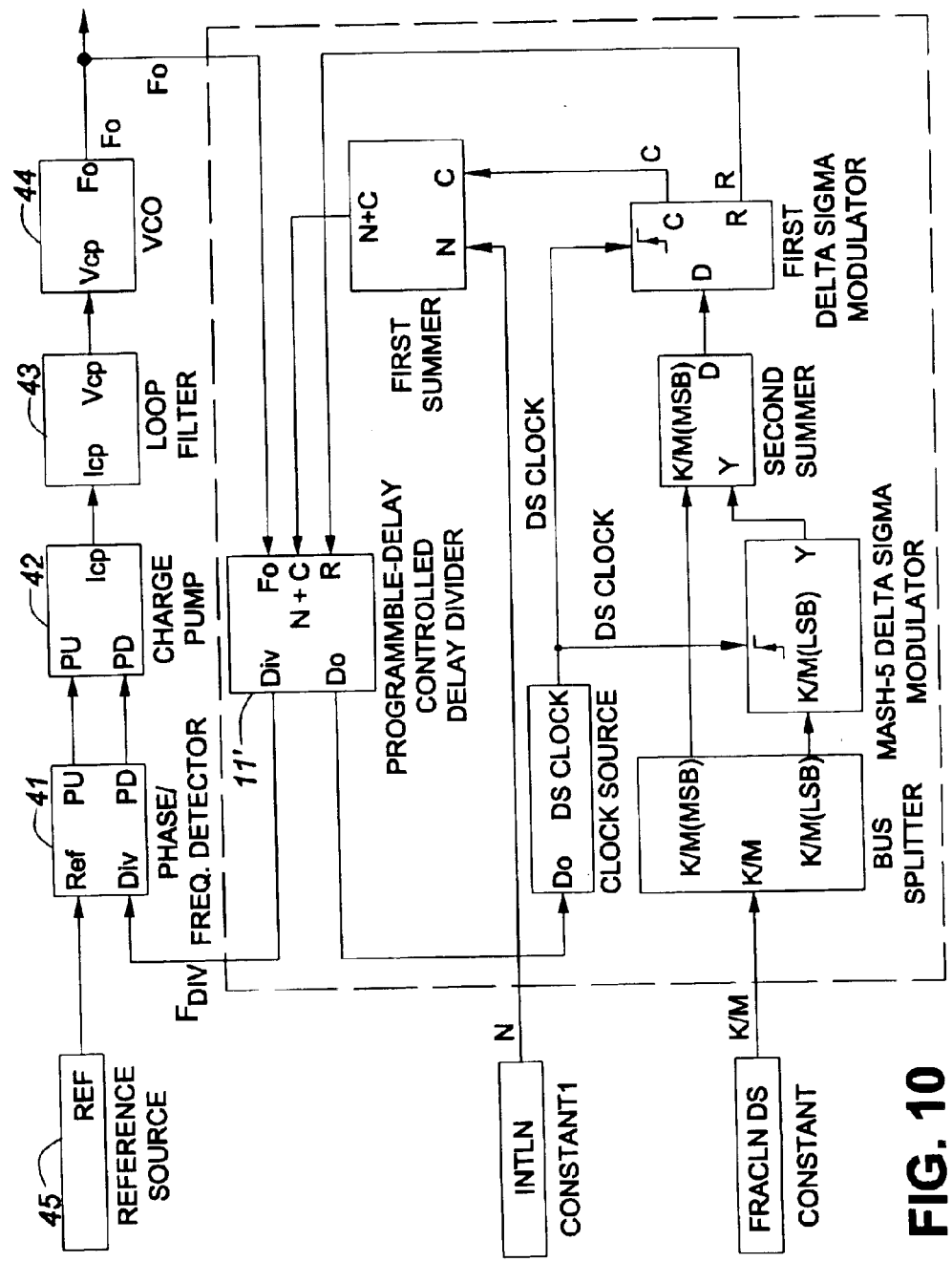
FIG. 10 is a block schematic diagram of a frequency synthesizer embodying the invention.

FIG. 10 is an illustration in block diagram form of the fractional divider of FIG. 9 incorporated into a PLL to form a frequency synthesizer. In this case, the Delta-Sigma Clock signal DS Clock is derived from the second divider output $D_0$, though it could be derived in the manner shown in FIG. 4. Use of the fractional divider in a phase locked loop allows the high frequency signal, with frequency $F_o$ to be the synthesizer output, which is useful when the invention is used as part of a local oscillator in a radio. The PLL comprises a phase frequency detector (PFD) 41, a charge pump 42, a loop filter 43 and a VCO 44. A signal of frequency $F_{REF}$ from a reference source 45 is applied to the reference input of the phase frequency detector 41 and the signal $F_{DIV}$ from the fractional divider is applied to the other DIVIDER input of the phase frequency detector 41. The UP and DOWN outputs of the PFD 41 are applied to the charge pump 42 to control its output current $I_{CP}$ which loop filter 43 converts to a corresponding control voltage $V_{CP}$ which adjusts the frequency of the VCO 44, providing the high frequency signal $F_o$ which is both the output of the frequency synthesizer and the input to the fractional divider.

The PLL also provides filtering to remove the noise-shaped quantization error introduced by the second Delta-Sigma modulator.

In embodiments of any of the various aspects of the invention arbitrarily fine resolution may be obtained by increasing the resolution (number of bits) of the second DSM.

The invention also comprehends an adjustable delay line per se having means for calibrating average element delay by comparing the total actual delay provided by the delay line with a reference period equal to the prescribed total delay.

INDUSTRIAL APPLICABILITY

Embodiments of the invention advantageously may be used in frequency synthesizers, especially those that are part of a larger integrated circuit with on-chip or off-chip resonator-based oscillators.

An advantage of the Programmable-Delay Controlled Delay Divider in which the delay line is calibrated is that it can widen the range of frequencies ($F_o$) over which the delays are correct for a given chip sample and temperature. It can also be used to correct for a wider range of temperature or for process variation.

Advantageously, in embodiments of the present invention the step size of the quantization noise, as compared to known Delta-Sigma synthesizers and the effect of Controlled Delay Divider delay nonlinearity is reduced as compared to known Controlled Delay Divider based dividers. Moreover, embodiments of the invention reduce the level of spurs by randomizing the controlled delays and thereby randomizing the Delay Error.

Although embodiments of the invention have been described and illustrated in detail, it is to be clearly understood that the same is by way of illustration and example only and not to be taken by way of the limitation, the spirit and scope of the present invention being limited only by the appended claims.

What is claimed is:

1. A frequency divider (11) having an input port for an input signal ($F_o$) to be divided, an output port for a divided signal ($F_{DIV}$), and means (12–19) for providing a variable division-ratio control signal (N+C) and a residual quantization error signal (R), applying the variable division ratio control signal (N+C) to a control port of the frequency divider, and using the residual quantization error signal (R) to cancel phase error in the divided signal, wherein both the variable division ratio control signal (N+C) and the residual quantization error signal (R) are dithered.

2. A frequency divider according to claim 1, wherein the providing means (12–19) comprises means (14) for providing a constant portion (N) of the division ratio control signal (N+C) means (13,15–19) for providing a dithered variable portion (C) of the division ratio control signal, and summing means (12) for combining the constant portion (N) and the dithered variable portion (C) to form the variable division ratio control signal (N+C).

3. A frequency divider according to claim 2, wherein the means (13,15–19) for providing a dithered variable portion (C) comprises a delta-sigma modulator (13) responsive to a dithered variable value (D) to provide both said dithered variable portion (C) and said dithered residual quantization error signal (R).

4. A frequency divider according to claim 3, wherein the delta-sigma modulator (13) is a first order delta-sigma modulator.

5. A frequency divider according to claim 3, wherein the means for providing the dithered variable value (l)) comprises means (16,18) for providing most significant parts (MSB) and least significant parts (LSB) of a binary word (K/M), means (17) for dithering the least significant part (LSB) to provide a dithered least significant part (Y), and second summing means (15) for summing the dithered least significant part (Y) with the most significant part (MSB).

6. A frequency divider according to claim 5, wherein the means (17) for dithering the least significant part (LSB) comprises a second delta-sigma modulator.

7. A frequency divider according to claim 6, wherein the second delta-sigma modulator is second or higher order.

8. A frequency divider according to claim 6, wherein the second delta-sigma modulator is clocked by a clock signal at the frequency of the divided signal ($F_{DIV}$).

9. A frequency divider according to claim 8, wherein the second delta-sigma modulator is clocked by a clock signal derived directly or indirectly from the input signal ($F_o$).

10. A frequency divider according to claim 9, wherein the clock signal is derived from the divided signal ($F_{DIV}$).

11. A frequency divider according to claim 8, wherein the first and second delta-sigma modulators are clocked by the same clock signal.

12. A frequency divider according to claim 3, wherein the delta-sigma modulator (13) is clocked by a clock signal at the frequency of the divided signal ($F_{DIV}$).

13. A frequency divider according to claim 12, wherein the clock signal is derived directly or indirectly from the input signal ($F_o$).

14. A frequency divider according to claim 12, wherein the clock signal is derived from the divided signal ($F_{DIV}$).

15. A frequency divider according to claim 1, wherein divider (11) is a programmable-delay controlled delay divider (PDDD).

16. A frequency divider according to claim 15, wherein the PDDD comprises a divider unit (24) for dividing the input signal ($F_o$) by said variable division-ratio control signal (N+C) to provide an undelayed divider output signal (P1), a delay line (23;23') having a plurality of inputs and a single output, a control unit (25) responsive to the residual quantization error signal (R) to apply the undelayed divider output signal (P1) to selected ones of the inputs of the delay line (23;23') to provide at the output of said delay line (23;23') said divided signal ($F_{DIV}$) delayed relative to the undelayed divider output signal (P1) by a predetermined amount.

17. A frequency divider according to claim 16, wherein the delay line (23') has a plurality of delay elements ($26_1, \ldots, 26_N$) and the PDDD (11) includes means (32–38) for calibrating average element delay.

18. A frequency divider according to claim 16, wherein the delay line (23') includes means for adjusting its average element delay in response to a control signal (Vc) and the PDDD (11) further comprises means (32–38) for comparing actual delay through the delay line (23) with a reference ($F_o$) and providing the control signal (Vc) in dependence upon the difference therebetween.

19. A frequency divider according to claim 18, wherein the reference is the input signal ($F_o$).

20. A frequency divider according to claim 16, wherein the control unit (25) comprises gating means ($27_1, \ldots, 27_N$) and logic means (28) responsive to the residual quantization error signal (R) for generating a plurality of delay control signals (xb1,xb2,xb3, . . . , xbn) and applying same to respective ones of said plurality of inputs of said delay line (23;23'), said gating means selectively applying said undelayed divider output signal (P1) to the inputs of the delay line (23') in dependence upon the delay control signals.

21. A method of dividing an input signal ($F_o$) by a non-integer value comprising the steps of:
(i) providing an integer value (N) and a fractional value (K/M) which together correspond to the non-integer value (N+K/M);
(ii) splitting the fractional value (K/M) into a first part ($K/M_{MSB}$) above a preset resolution and a second part ($K/M_{LSB}$) below said preset resolution;
(iii) using noise-shaped quantization, quantizing the second purr ($K/M_{LSB}$) at a quantization resolution equal to the least significant bit of said first part ($K/M_{MSB}$) to produce a noise-shaping-quantized value;
(iv) summing said first part ($K/M_{MSB}$) and the noise-shaping-quantized value to produce a dithered value (D);
(v) quantizing the dithered value (D) to provide a quantized dithered value (C) having a resolution equal to the least significant bit of the integer value (N) and an integrated residual value (R);
(vi) summing said quantized dithered value (C) with said integer value (N) to provide a division ratio value (N+C);
(vii) in dependence upon said residual value (R), dividing the input signal frequency ($F_o$) by said division ratio value (N+C) to provide an output frequency ($F_{DIV}$).

22. A method of dividing an input signal ($F_o$) to obtain a divided signal ($F_{DIV}$), using a frequency divider (11), comprising the steps of providing a variable division-ratio control signal (N+C) and a residual quantization error signal (R), applying the variable division ratio control signal (N+C) to control the frequency divider, and using the residual quantization error signal (R) to cancel phase error in the divided signal, wherein both the variable division ratio control signal (N+C) and the residual quantization error signal (R) are dithered.

23. A method according to claim 22, wherein the step of providing a variable division-ratio control signal (N+C) includes the steps of providing a constant portion (N) of the division ratio control signal (N+C), and a dithered variable portion (C) of the division ratio control signal, and summing the constant portion (N) and the dithered variable portion (C) to form the variable division ratio control signal (N+C).

24. A method according to claim 23, wherein the step of providing the dithered variable portion (C) uses a delta-sigma modulator (13) responsive to a dithered variable value (D) to provide both said dithered variable portion (C) and said dithered residual quantization error signal (R).

25. A method according to claim 24, wherein the delta-sigma modulator used in the step of providing the dithered variable portion (C) is a first order sigma-delta modulator.

26. A method according to claim 24, wherein the step of providing the dithered variable value (D) includes the steps of providing most significant parts (MSB) and least significant parts (LSB) of a binary word (K/M), dithering the least significant part (LSB) to provide a dithered least significant part (Y), and summing the dithered least significant part (Y) with the most significant part (MSB).

27. A method according to claim 26, wherein the step of dithering the least significant part (LSB) uses a second delta-sigma modulator.

28. A method according to claim 26, wherein the dithering of the least significant part (LSB) is performed by a second delta-sigma modulator that is second or higher order.

29. A method according to claim 24, wherein the delta-sigma modulator (13) is clocked by a clock signal at the frequency of the divided signal ($F_{DIV}$).

30. A method according to claim 29, wherein the clock signal is derived directly or indirectly from the input signal ($F_o$).

31. A method according to claim 29, wherein the clock signal is derived from the divided signal ($F_{DIV}$).

32. A method according to claim 29, wherein the second delta-sigma modulator is clocked by a clock signal at the frequency of the divided signal ($F_{DIV}$).

33. A method according to claim 32, wherein the second delta-sigma modulator is clocked by a clock signal derived directly or indirectly from the input signal ($F_o$).

34. A method according to claim 33, wherein the second clock signal is derived from the divided signal ($F_{DIV}$).

35. A method according to claim 32, wherein the first and second delta-sigma modulators are clocked by the same clock signal.

36. A method according to claim 22, wherein the divider (11) used to obtain the divided signal ($F_{DIV}$) is a programmable-delay controlled delay divider (PDDD).

37. A method according to claim 36, wherein the input signal ($F_o$) is divided by said variable division-ratio control signal (N+C) to provide an undelayed divider output signal (P1), delayed by a delay line (23;23') having a plurality of inputs and a single output, and, in dependence upon the residual quantization error signal (R), the undelayed divider output signal (P1) is applied to selected ones of the inputs of the delay line (23;23') to provide at the output of said delay line (23;23') said divided signal ($F_{DIV}$) delayed relative to the undelayed divider output signal (P1) by a predetermined amount.

38. A method according to claim 37, wherein the delay line (23') used to delay the divider output signal (P1) has a plurality of delay elements ($26_1, \ldots, 26_N$) and the method further comprises the step of calibrating average element delay.

39. A method according to claim 37, including the step of adjusting the average element delay of the delay line in response to a control signal (Vc), comparing actual delay through the delay line (23) with a reference ($F_o$), and providing the control signal (Vc) in dependence upon the difference therebetween.

40. A method according to claim 39, wherein the reference is the input signal ($F_o$).

41. A method according to claim 37, comprising the steps of, responsive to the residual quantization error signal (R), generating a plurality of delay control signals (xb1,xb2,xb3, . . . , xbn) and selectively applying said undelayed divider output signal (P1) to the inputs of the delay line (23') in dependence upon the delay control signals.

* * * * *